(12) United States Patent
Sun et al.

(10) Patent No.: US 6,232,646 B1
(45) Date of Patent: *May 15, 2001

(54) SHALLOW TRENCH ISOLATION FILLED WITH THERMAL OXIDE

(75) Inventors: Yu Sun, Saratoga; Angela T. Hui, Fremont; Yue-Song He, San Jose, all of CA (US); Tatsuya Kajita, Aizuwakamatsu (JP); Mark Chang, Los Altos, CA (US); Chi Chang, Redwood City, CA (US); Hung-Sheng Chen, San Jose, CA (US)

(73) Assignee: Advanced Micro Devices, Inc., Sunnyvale, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/082,607

(22) Filed: May 20, 1998

(51) Int. Cl.[7] .................................................. H01L 29/00
(52) U.S. Cl. ................... 257/520; 257/374; 257/396; 257/510; 257/501; 257/506; 257/499
(58) Field of Search .................................. 257/520, 374, 257/396, 398, 510, 501, 506, 499; 438/426, 425

(56) References Cited

U.S. PATENT DOCUMENTS

| | | | |
|---|---|---|---|
| 5,679,599 | * | 10/1997 | Mehta ................................ 437/69 |
| 5,747,866 | * | 5/1998 | Ho et al. ............................ 257/506 |
| 5,798,553 | * | 8/1998 | Furukawa et al. .................. 257/394 |
| 5,868,870 | * | 2/1999 | Fazan et al. ....................... 148/33.3 |
| 5,895,253 | * | 4/1999 | Akram ............................... 438/424 |
| 5,910,018 | * | 6/1999 | Jang ................................... 438/425 |
| 5,945,724 | * | 8/1999 | Parekh et al. ..................... 257/510 |
| 6,064,104 | * | 5/2000 | Omid-Zohoor et al. ........... 257/510 |

* cited by examiner

Primary Examiner—Eddie C. Lee
Assistant Examiner—Jesse A. Fenty
(74) Attorney, Agent, or Firm—Lariviere, Grubman & Payne, LLP

(57) ABSTRACT

A semiconductor apparatus and method for producing shallow trench isolation. The method includes the steps providing a semiconductor substrate member fabricated having a thin barrier oxide layer on which are fabricated a plurality of spaced apart silicon nitride pads. The regions between the spaced apart nitride pads delineate U-shaped regions for forming shallow isolation trenches and are layered with silicon oxide and polysilicon. The U-shaped regions provide a buffer region of oxide and polysilicon material adjacent opposing silicon nitride pads that prevent erosion of the nitride during etch formation of the isolation trench. The polysilicon is further etched to form a wider, second U-shaped region having sloped sidewalls that provide opposing spacer-forming buffer material that facilitates forming a V-shaped isolation trench region into the semiconductor substrate member a predetermined depth without eroding the silicon nitride pads. The V-shaped trench is subsequently filled with silicon dioxide that is grown by a hot thermal oxide process. The upper portion of the V-shaped isolation trench may be further filled with deposited silicon dioxide followed by a chemical mechanical polishing process.

2 Claims, 4 Drawing Sheets

SHALLOW TRENCH ISOLATION FILLED WITH THERMAL OXIDE

TECHNICAL FIELD

The present invention relates to integrated circuits and fabrication techniques for forming field oxide (FOX) regions on the integrated circuit substrate. More particularly, the present invention relates to fabrication techniques for forming shallow trench isolation (STI) regions on the integrated circuit substrate.

BACKGROUND OF THE INVENTION

The processes for fabricating semiconductor devices includes process steps for providing isolation regions that contain dielectric materials that provide the necessary protection for assuring proper function of the formed electronic integrated circuit design. The process includes LOCOS which is localized oxidation of silicon. This process typically begins by depositing a silicon nitride layer over a silicon dioxide layer (barrier oxide) to a thickness in the range of 0.05 μm. to 0.10 μm. The silicon nitride is typically deposited using low-pressure chemical vapor deposition (LPCVD) techniques. A photoresist mask layer, comprising any appropriate commercially available photoresist material known in the industry, is then deposited over the silicon nitride layer The photoresist mask layer is then patterned for forming isolation trenches. Upon etching, the isolation trench regions are formed adjacent silicon oxide layer and the silicon nitride layer and a portion of the photoresist layer. Typically, in order to form the trench regions, the upper surface of the substrate is etched a small amount, approximately 0.25 μm. An oxide layer is formed in the isolation regions by depositing a thick pad of silicon dioxide using tetraethylorthosilicate (TEOS) as the source for deposition of silicon dioxide. The thickness of the oxide pad, also referred to as a field oxide (FOX) pad, is in the range of 1.2 μm to 1.5 μm. The process further includes polishing of the formed isolation pads to a surface level and thickness substantially even with the silicon nitride level. Subsequent to formation of the oxide pads the silicon nitride and silicon dioxide layer regions are removed by wet etching to expose the active region which will be used to form the various integrated circuit components. The wet etching is typically done using hot phosphoric acid to first etch the silicon nitride layer, then by dipping the substrate in a hydrofluoric acid (HF) dip to etch the silicon dioxide layer.

As seen from the foregoing, formation of the trench region, in accordance with prior art techniques, erodes the adjacent barrier oxide and silicon nitride layers protecting the active regions. Thus, a need is seen to exist for a method of forming the isolation trenches without eroding the adjacent silicon nitride pads and barrier oxide that overlay the active regions of the semiconductor structure.

Accordingly, a primary object of the present invention is to provide a method for forming isolation trenches such that the adjacent structure protecting the active semiconductor substrate is not eroded during etching processes used to form the trench regions.

BRIEF SUMMARY OF THE INVENTION

Accordingly, the foregoing object is accomplished by providing a semiconductor substrate member fabricated having a thin barrier oxide layer on which are fabricated a plurality of spaced apart silicon nitride pads. The regions between the spaced apart nitride pads delineate U-shaped regions for forming shallow isolation trenches and are layered with silicon oxide and polysilicon. The U-shaped regions provide a buffer region of oxide and polysilicon material adjacent opposing silicon nitride pads that prevent erosion of the nitride during etch formation of the isolation trench. The polysilicon is further etched to form a wider, second U-shaped region having sloped sidewalls that provide opposing spacerforming buffer material that facilitates forming a V-shaped isolation trench region into the semiconductor substrate member a predetermined depth without eroding the silicon nitride pads. The V-shaped trench is subsequently filled with silicon dioxide that is grown by a hot thermal oxide process. The upper portion of the V-shaped isolation trench may be further filled with deposited silicon dioxide followed by a chemical mechanical polishing process.

Other features of the present invention are disclosed or apparent in the section entitled: "DETAILED DESCRIPTION OF THE INVENTION".

BRIEF DESCRIPTION OF DRAWINGS

For fuller understanding of the present invention, reference is made to the accompanying drawings and the following Detailed Description of the Invention. In the drawings.

Figure 1:
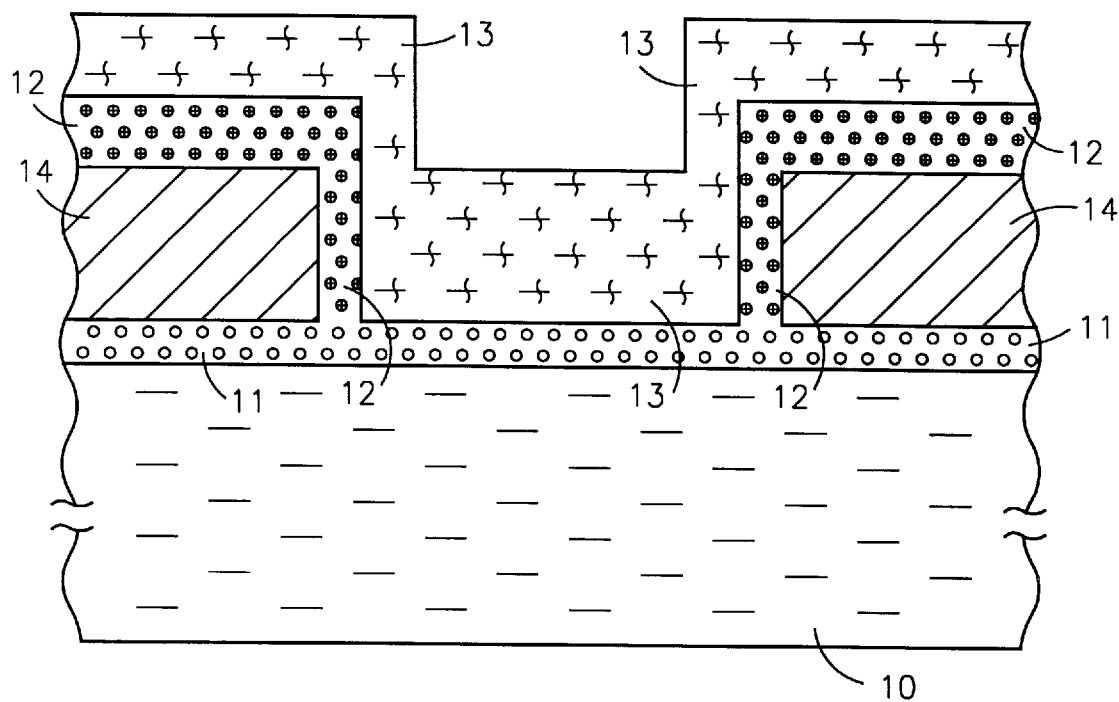
FIG. 1 is a cross-sectional view of first U-shaped notch in a region delineated for forming shallow isolation trenches in accordance with the present invention.

Reference numbers refer to the same or equivalent parts of the present invention throughout the several figures of the drawing.

DETAILED DESCRIPTION OF THE INVENTION

FIGS. 1–5 comprise trench isolation fabrication steps for use in fabrication of the shallow trench isolation structure in accordance with the present invention. As shown in FIG. 1, a semiconductor substrate member 10 has been fabricated to a stage such that a barrier oxide layer 11, comprising a first silicon dioxide layer, has been formed overlaying silicon substrate 10. FIG. 1 also shows a plurality of spaced apart silicon nitride pads 14 that have been fabricated over portions of barrier oxide layer 11. Subsequent to formation of the nitride layers pads 14, a second silicon oxide layer 12 comprising, by example, a hot thermal oxide, is grown over, and on sidewall portions, of the silicon nitride pads 14, as well as over portions of barrier oxide 11 in the regions between the silicon nitride pads 14. The regions between silicon nitride pads 14 comprising regions for forming shallow isolation trenches. After formation of the hot thermal oxide layer 12 a polysilicon layer 13 is formed over the oxide layer 12 such that the polysilicon layer 13 forms a first U-shaped notch in the region delineated for forming said shallow isolation trenches. The material comprising the polysilicon 13 and hot thermal oxide 12 provides a buffer region for shaping the isolation trench and protecting the corners of the nitride pads 14 during an etching process step.

Figure 2:
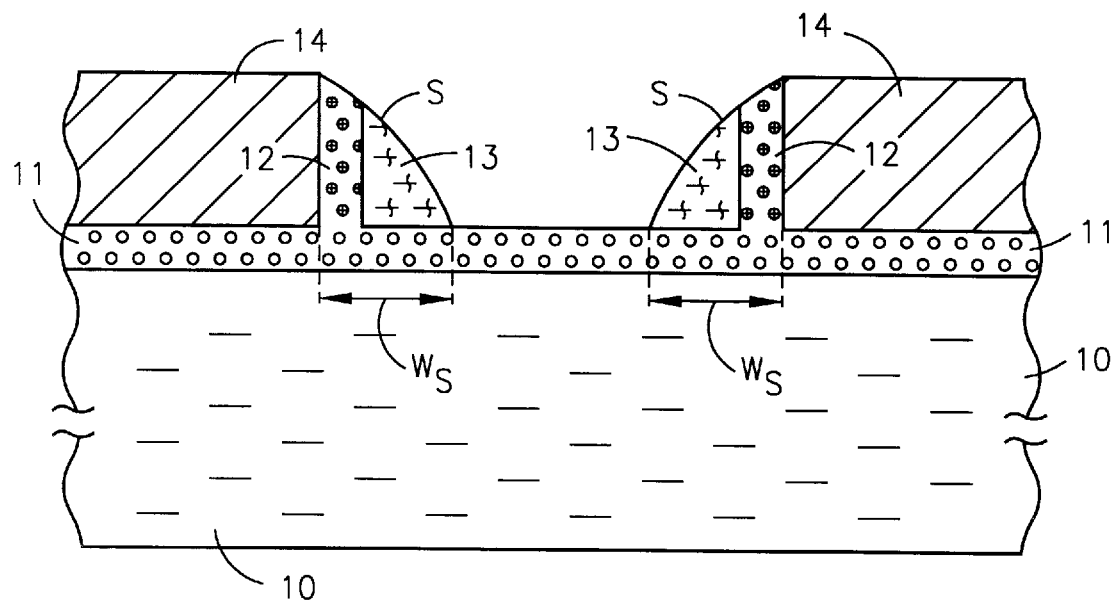
FIG. 2 is a cross-sectional view of a second U-shaped notch having sloped sidewalls that form opposing spacer region comprising tapering amounts of oxide and polysilicon material that prevent erosion of the silicon nitride pads.
Figure 3:
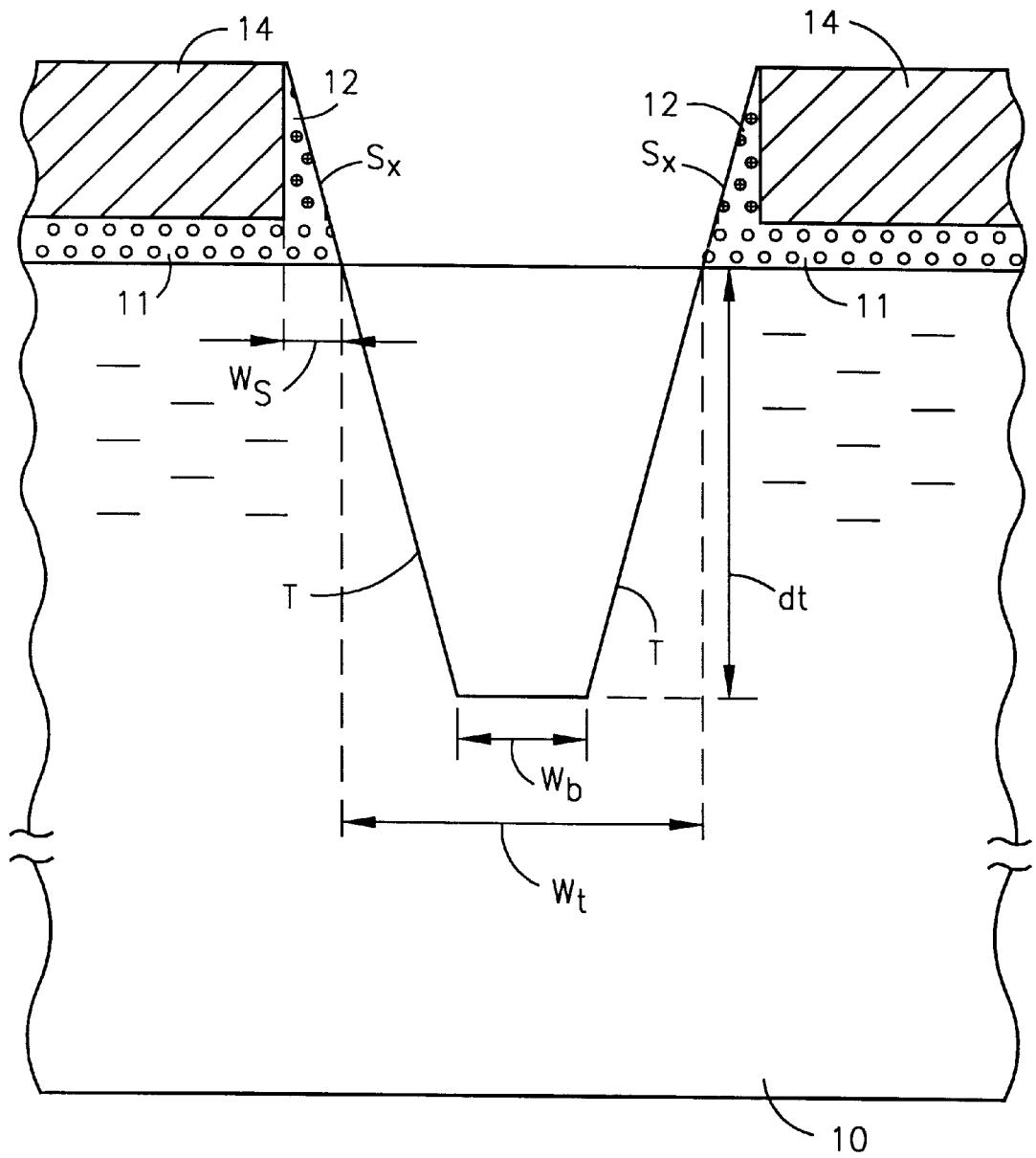
FIG. 3 is a cross-sectional view of a V-shaped isolation trench region fabricated into said semiconductor substrate member in accordance with the present invention.
Figure 4:
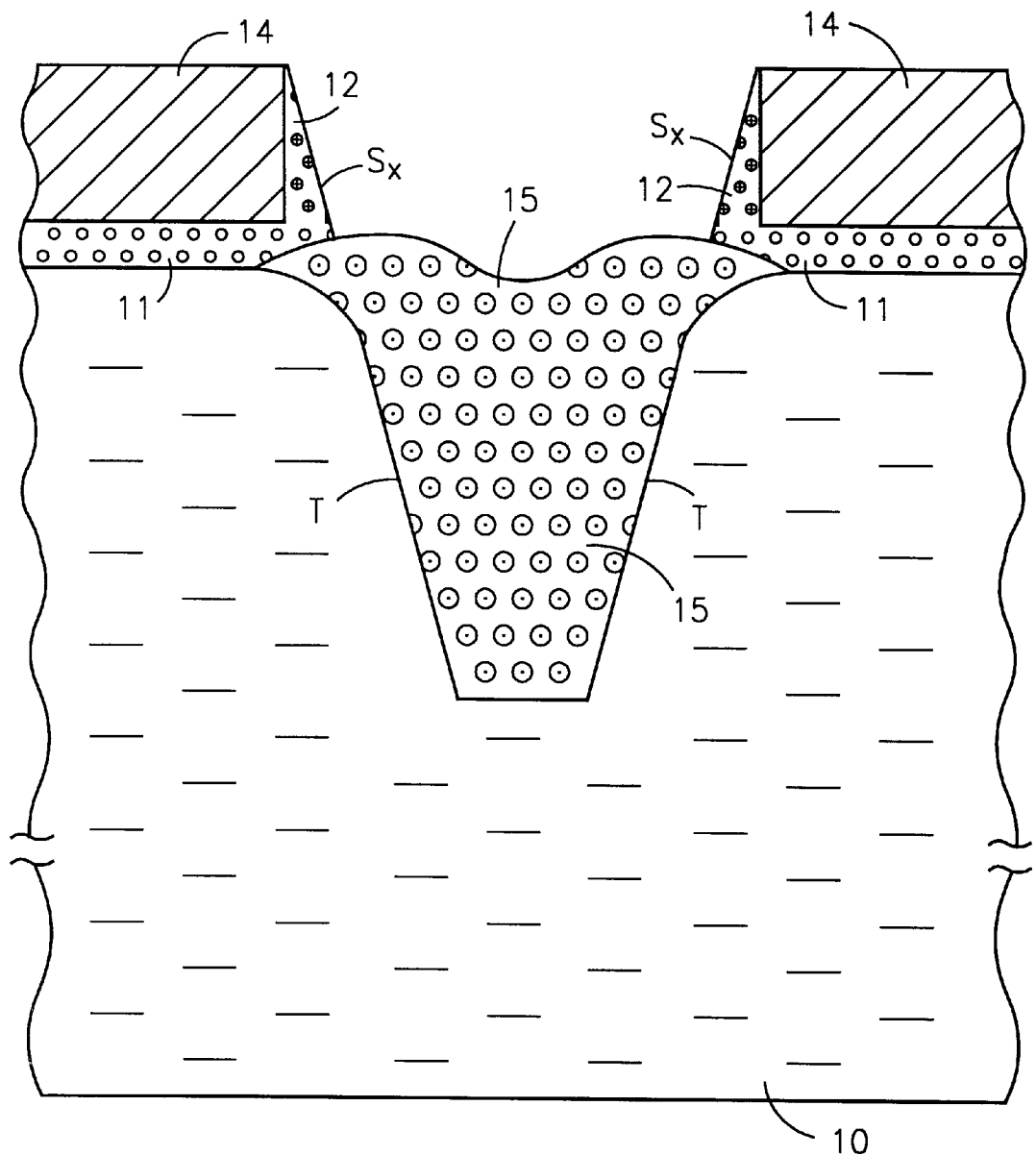
FIG. 4 is a cross-sectional view of a V-shaped isolation trench region formed as shown in FIG. 3 and further showing a trench isolation material comprising silicon dioxide grown within a substantial portion of the V-shaped trench region.
Figure 5:
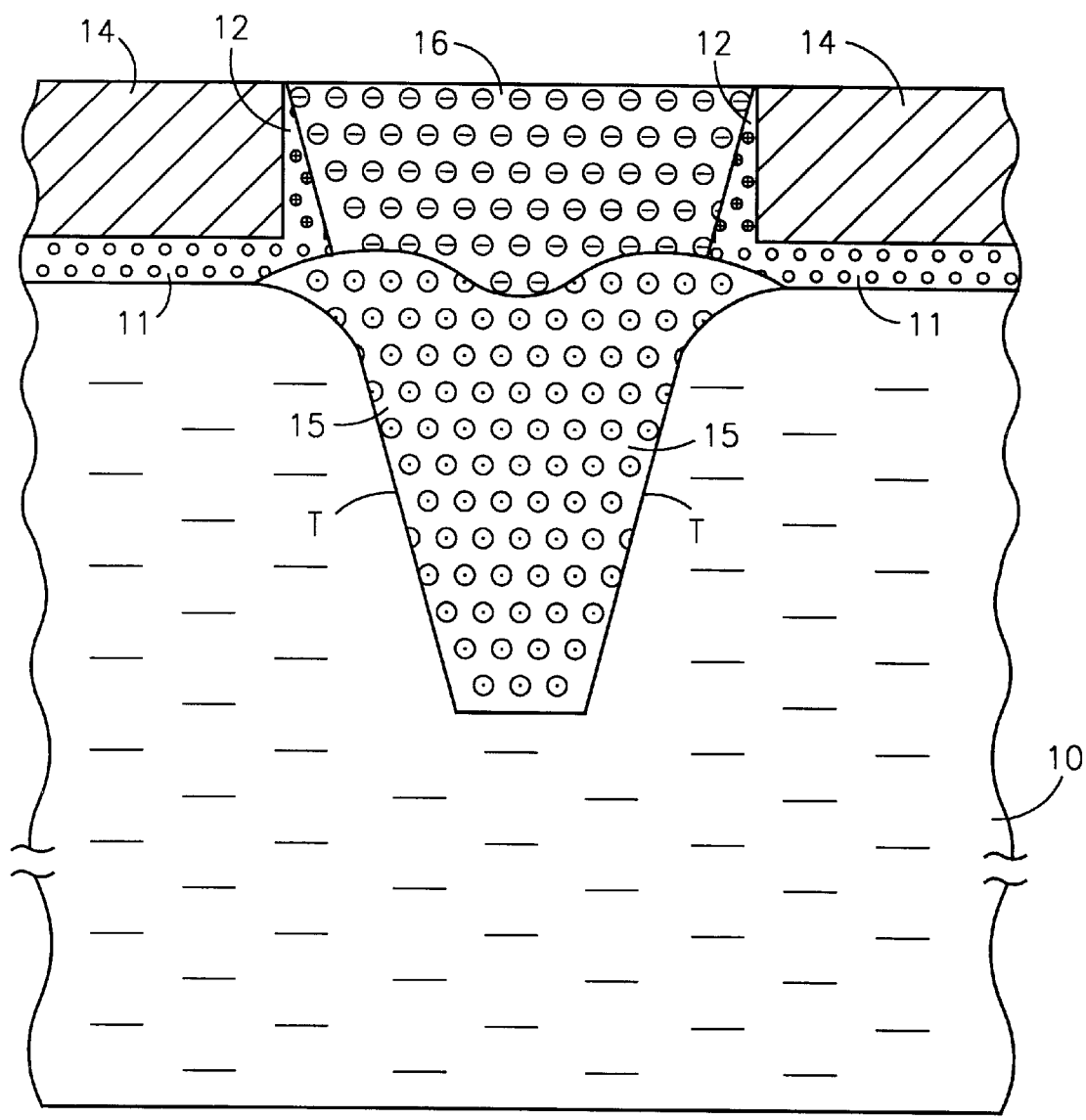
FIG. 5 is a cross-sectional view of a V-shaped isolation trench region formed as shown in FIG. 4 further showing an upper end of the V-shaped isolation trench region with deposited silicon dioxide material in accordance with the present invention.

FIG. 2 shows a first etching step that shapes the first U-shaped notch of polysilicon material such that a wider, second U-shaped notch is formed. The second U-shaped notch is formed such that spacers S are formed comprising buffer material region of oxide and polysilicon material that offset the nitride pads a varying distance Ws. As best seen in FIG. 3, spacers S facilitate forming a V-shaped isolation trench region T into semiconductor substrate member 10. The width Ws of spacers S are reduced by etching action while isolation trench region T is being fabricated. Basically, all of the polysilicon material 13, comprising sidewalls of the second U-shaped notch, are etched away during formation of trench T, leaving a remaining oxide spacer S. The V-shaped isolation trench structure comprises an upper end portion forming an opening having a width $W_t$ measuring, by example 0.2 $\mu$m, and a bottom end portion having a width $W_b$ measuring substantially less than 0.2 $\mu$m. The V-shaped trench T is etched into semiconductor substrate 10 a predetermined depth dt ranging from 500Å to 2000Å. Subsequent to formation of trench T, an isolation material 15 is grown from the opposing silicon sidewall structure in the trench region. The isolation material 15 is grown, by example using a hot thermal oxide HTO process. The oxide material 11, 12 in the upper trench region gets thicker during the HTO process. The extremely small dimensions associated with trench structure T facilitate a pinching effect of the oxide material being grown to fill the trench region. FIG. 4 shows oxide material 15 filling a substantial portion of the V-shaped trench T. Also as seen in FIG. 4, the upper portion of the V-shaped trench adjacent the spacers $S_x$ are void of oxide material. FIG. 5 shows additional oxide material 16 deposited over oxide material 15 to complete formation and filling of trench T. The additional oxide material is deposited by industry known chemical vapor deposition method. A roughness in the structure is polished by chemical mechanical polishing techniques.

The present invention has been particularly shown and described with respect to a certain preferred embodiment and features thereof. However, it should be readily apparent to those of ordinary skill in the art that various changes and modifications in form, semiconductor material, material conductivity type i.e. N-type, or P-type, and detail may be made without departing from the spirit and scope of the inventions as set forth in the appended claims. The inventions illustratively disclosed herein may be practiced without any element which is not specifically disclosed herein.

What is claimed is:

1. A semiconductor apparatus, said apparatus comprising:
a semiconductor substrate member;
at least one pair of spaced apart first dielectric material pads formed on said semiconductor member
a region between said spaced apart dielectric material pads delineating a semiconductor substrate region for forming an isolation trench; and
a temporal sloped U-shaped buffer region comprising an oxide and a sacrificial polysilicon material,
said temporal sloped U-shaped buffer region being formed and disposed between said at least one pair of spaced apart first dielectric material pads and overlying said delineated semiconductor substrate region,
said temporal sloped U-shaped buffer region comprising a spacer material,
said spacer material comprising opposing sidewalls of said oxide and said sacrificial polysilicon material, and
said spacer material offsetting said dielectric material pads by a distance for preventing erosion of said dielectric material pads during formation of said isolation trench region,
wherein said opposing side walls of said spacer material comprise a reducible width for facilitating formation of said V-shaped isolation trench region, and
wherein said opposing side walls comprise opposed sloped oxide spacers, said opposed sloped oxide spacers resulting from etching-away of said sacrificial polysilicon material during formation of said V-shaped isolation trench,
wherein said semiconductor substrate comprises a silicon material, and
wherein said at least one pair of spaced apart first dielectric material pads comprises a silicon nitride material; and
a silicon dioxide material, said silicon dioxide material comprising:
a hot thermal oxide being disposed within a bottom portion of said V-shaped isolation trench, and
a deposited oxide being disposed within a top portion of said formed V-shaped isolation trench located in a region defined by said opposed sloped oxide spacers,
wherein said silicon nitride pads comprise non-eroded corners having adjacent respective ones of said opposed sloped oxide spacers that facilitate said corners being protected by said spacer material.

2. A semiconductor apparatus, said apparatus comprising:
a semiconductor substrate member;
at least one pair of spaced apart first dielectric material pads formed on said semiconductor member,
a region between said spaced apart dielectric material pads delineating a semiconductor substrate region for forming an isolation trench region; and
a temporal sloped U-shaped buffer region comprising an oxide and a sacrificial polysilicon material,
said temporal sloped U-shaped buffer region being formed and disposed between said at least one pair of spaced apart first dielectric material pads and overlying said delineated semiconductor substrate region,
said temporal sloped U-shaped buffer region comprising a spacer material,
said spacer material comprising opposing sidewalls of said oxide and said sacrificial polysilicon material, said spacer material,
said spacer material offsetting said dielectric material pads by a distance for preventing erosion of said dielectric material pads during formation of said isolation trench region,
said isolation trench region being formed as a V-shaped isolation trench region into said semiconductor substrate member,
wherein said opposing side walls of said spacer material comprise a reducible width for facilitating formation of said V-shaped isolation trench region,
wherein said opposing side walls comprise opposed sloped oxide spacers, said opposed sloped oxide spacers resulting from etching-away of said sacrificial polysilicon material during formation of said V-shaped isolation trench, wherein said semiconductor substrate comprises a silicon material, and wherein said at least one pair of spaced apart first dielectric material pads comprise a silicon nitride material; and a silicon dioxide material, said silicon dioxide material comprising, a hot thermal oxide being disposed within a bottom portion of said formed V-shaped isolation trench, and a deposited oxide being disposed above said hot thermal oxide and within a top portion of said formed V-shaped isolation trench located in a region defined by said opposed sloped oxide spacers, wherein each of said silicon nitride pads comprises non-eroded corners, each respective said pad being disposed adjacent to each respective said opposed sloped oxide spacer and said corners being protected by said each respective said spacer.

* * * * *

UNITED STATES PATENT AND TRADEMARK OFFICE
CERTIFICATE OF CORRECTION

PATENT NO. : 6,232,646 B1 Page 1 of 1
DATED : May 15, 2001
INVENTOR(S) : Yu Sun, Angela T. Hui, Yue-Song He, Tatsuya Kajita, Mark Chang, Chi Chang, Hung-Sheng Chen It is certified that error appears in the above-identified patent and that said Letters Patent is hereby corrected as shown below:

Column 3,
Line 22, after the word "spacer" delete [S] and replace with -- $S_x$ --.

Signed and Sealed this

Thirtieth Day of October, 2001

*Attest:*

*Attesting Officer*

NICHOLAS P. GODICI
*Acting Director of the United States Patent and Trademark Office*